(12) United States Patent
Liu

(10) Patent No.: US 10,671,789 B2
(45) Date of Patent: Jun. 2, 2020

(54) INTEGRATED CIRCUIT AND LAYOUT METHOD

(71) Applicant: TAIWAN SEMICONDUCTOR MANUFACTURING CO., LTD., Hsinchu (TW)

(72) Inventor: Jack Liu, Taipei (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 277 days.

(21) Appl. No.: 15/655,763

(22) Filed: Jul. 20, 2017

(65) Prior Publication Data

US 2017/0316144 A1 Nov. 2, 2017

Related U.S. Application Data

(62) Division of application No. 14/985,100, filed on Dec. 30, 2015, now Pat. No. 9,727,683.

(51) Int. Cl.
| | |
|---|---|
| *G06F 30/394* | (2020.01) |
| *G06F 30/392* | (2020.01) |
| *H01L 23/522* | (2006.01) |
| *H01L 23/528* | (2006.01) |

(52) U.S. Cl.
CPC ........ *G06F 30/394* (2020.01); *H01L 23/5226* (2013.01); *H01L 23/5283* (2013.01); *G06F 30/392* (2020.01); *H01L 23/528* (2013.01)

(58) Field of Classification Search
USPC ........................................................ 716/126
See application file for complete search history.

(56) References Cited

U.S. PATENT DOCUMENTS

| | | | |
|---|---|---|---|
| 6,449,198 B1 * | 9/2002 | Hamade | G11C 7/1048 365/189.14 |
| 6,951,806 B1 | 10/2005 | Schweikert et al. | |
| 8,227,699 B2 | 7/2012 | Honjo | |
| 8,324,979 B2 | 12/2012 | Cho | |
| 8,638,307 B2 | 1/2014 | Golovchenko et al. | |
| 8,745,571 B2 | 6/2014 | Li et al. | |
| 10,056,973 B2 * | 8/2018 | Syed | H04B 10/032 |
| 2007/0046876 A1 | 3/2007 | Nishikawa et al. | |
| 2012/0309120 A1 | 12/2012 | Takahashi et al. | |
| 2013/0021304 A1 | 1/2013 | Zuo et al. | |
| 2013/0252379 A1 | 9/2013 | Becker et al. | |
| 2013/0320994 A1 | 12/2013 | Brittain et al. | |
| 2016/0211212 A1 | 7/2016 | Chao et al. | |

* cited by examiner

*Primary Examiner* — Bryce M Aisaka
(74) *Attorney, Agent, or Firm* — Maschoff Brennan

(57) ABSTRACT

A system includes at least one Input/Output (I/O) interface and a processor. The processor is coupled to the at least one I/O interface. The processor is configured to perform, according to a file or a rule inputted from the at least one I/O interface, operations below. When the at least one condition is present in a signal to be received or transmitted by a terminal of a cell, a plurality of conductive segments is assigned to the terminal of the cell, to transmit the signal to the terminal of the cell. When the at least one condition one is not present in the signal, a single route is assigned to the terminal of the cell, to transmit the signal to the terminal of the cell. The single route and each of the conductive segments are configured to have the same width.

20 Claims, 3 Drawing Sheets

INTEGRATED CIRCUIT AND LAYOUT METHOD

REFERENCE TO RELATED APPLICATION

This application is a divisional application of U.S. application Ser. No. 14/985,100 filed on Dec. 30, 2015, which is incorporated herein by reference.

BACKGROUND

Routing a circuit design involves determining routes for metal wires which electrically connect circuit elements to produce routed circuits that perform desired functions. Routing rules are applied to specify the constraints on a circuit layout. However, non-default routing rules (NDRs) are applied to some circuits which need to satisfy special requirements which are non-existent for other parts of the circuit design.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
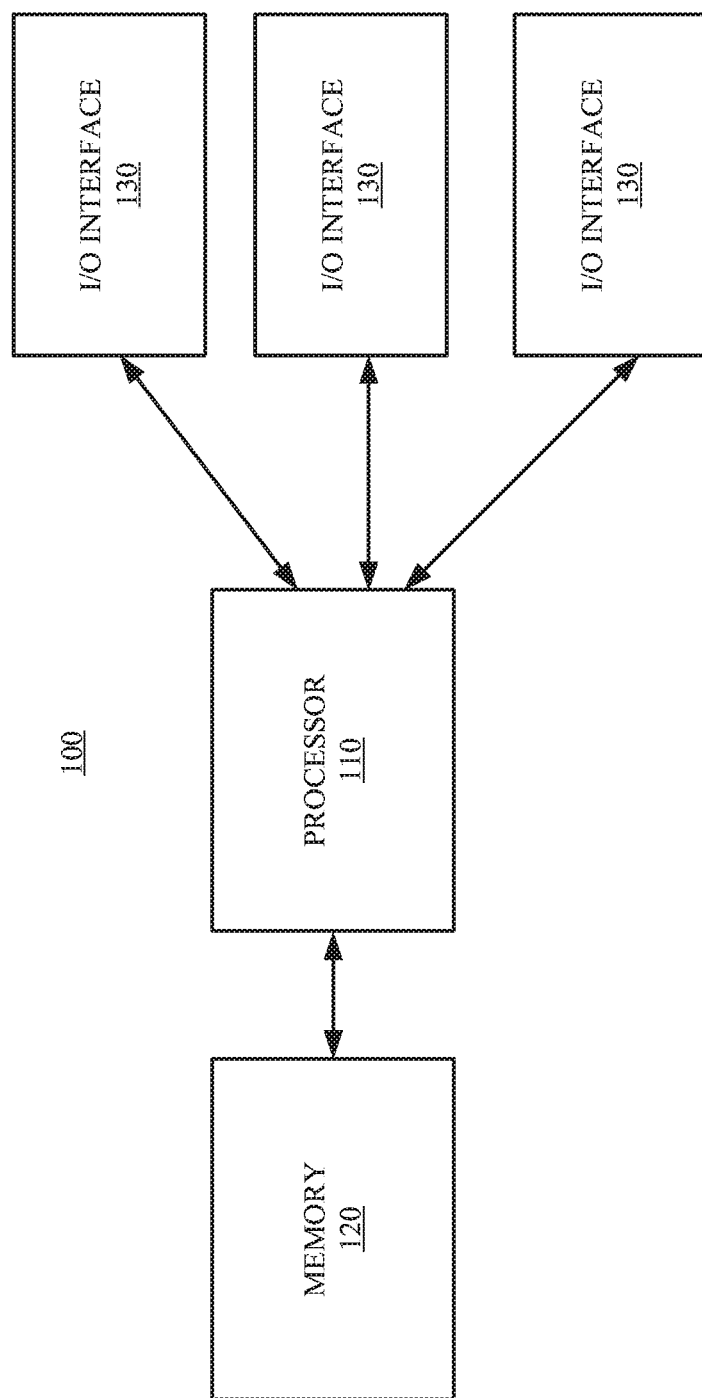
FIG. 1 is a schematic diagram of a design system, in accordance with various embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The terms used in this specification generally have their ordinary meanings in the art and in the specific context where each term is used. The use of examples in this specification, including examples of any terms discussed herein, is illustrative only, and in no way limits the scope and meaning of the disclosure or of any exemplified term. Likewise, the present disclosure is not limited to various embodiments given in this specification.

Although the terms "first," "second," etc., may be used herein to describe various elements, these elements should not be limited by these terms. These terms are used to distinguish one element from another. For example, a first element could be termed a second element, and, similarly, a second element could be termed a first element, without departing from the scope of the embodiments. As used herein, the term "and/or" includes any and all combinations of one or more of the associated listed items.

In this document, the term "coupled" may also be termed as "electrically coupled", and the term "connected" may be termed as "electrically connected". "Coupled" and "connected" may also be used to indicate that two or more elements cooperate or interact with each other.

FIG. 1 is a schematic diagram of a design system 100, in accordance with some embodiments of the present disclosure.

As illustratively shown in FIG. 1, the design system 100 includes a processor 110, a memory 120, and Input/Output (I/O) interfaces 130. The processor 110 is coupled to the memory 120 and the I/O interfaces 130. In various embodiments, the processor 110 is a central processing unit (CPU), an application specific integrated circuit (ASIC), a multi-processor, a distributed processing system, or a suitable processing unit. Various circuits or units to implement the processor 110 are within the contemplated scope of the present disclosure.

The memory 120 stores one or more program codes for aiding design of integrating circuits. For illustration, the memory 120 stores a program code encoded with a set of instructions for performing layout process or checking layout patterns of the integrating circuits. The processor 110 is able to execute the program codes stored in the memory 120, and the operations of wire routing are able to be automatically performed.

In some embodiments, the memory 120 is a non-transitory computer readable storage medium encoded with, i.e., storing, a set of executable instructions for performing layout process or checking layout patterns. For illustration, the memory 120 stores executable instructions for performing operations including, for example, operation S210-S276 illustrated in FIG. 3. In some embodiments, the computer readable storage medium is an electronic, magnetic, optical, electromagnetic, infrared, and/or a semiconductor system (or apparatus or device). For example, the computer readable storage medium includes a semiconductor or solid-state memory, a magnetic tape, a removable computer diskette, a random access memory (RAM), a read-only memory (ROM), a rigid magnetic disk, and/or an optical disk. In one or more embodiments using optical disks, the computer readable storage medium includes a compact disk-read only memory (CD-ROM), a compact disk-read/write (CD-R/W), a digital video disc (DVD), a flash memory, and/or other media, now known or later developed, that are capable of storing code or data. Hardware modules or apparatuses described in this disclosure include, but are not limited to, application-specific integrated circuits (ASICs), field-programmable gate arrays (FPGAs), dedicated or shared processors, and/or other hardware modules or apparatuses now known or later developed.

The I/O interfaces 130 receive inputs or commands from various control devices which, for example, are operated by a circuit designer and/or a layout designer. Accordingly, the design system 100 is able to be manipulated with the inputs or commands received by the I/O interfaces 130. In some embodiments, the I/O interfaces 130 include a display configured to display the status of executing the program code. In some embodiments, the I/O interfaces 130 include a graphical user interface (GUI). In some other embodiments, the I/O interfaces 130 include a keyboard, keypad, mouse, trackball, track-pad, touch screen, cursor direction keys, or the combination thereof, for communicating information and commands to processor 110.

Figure 2:
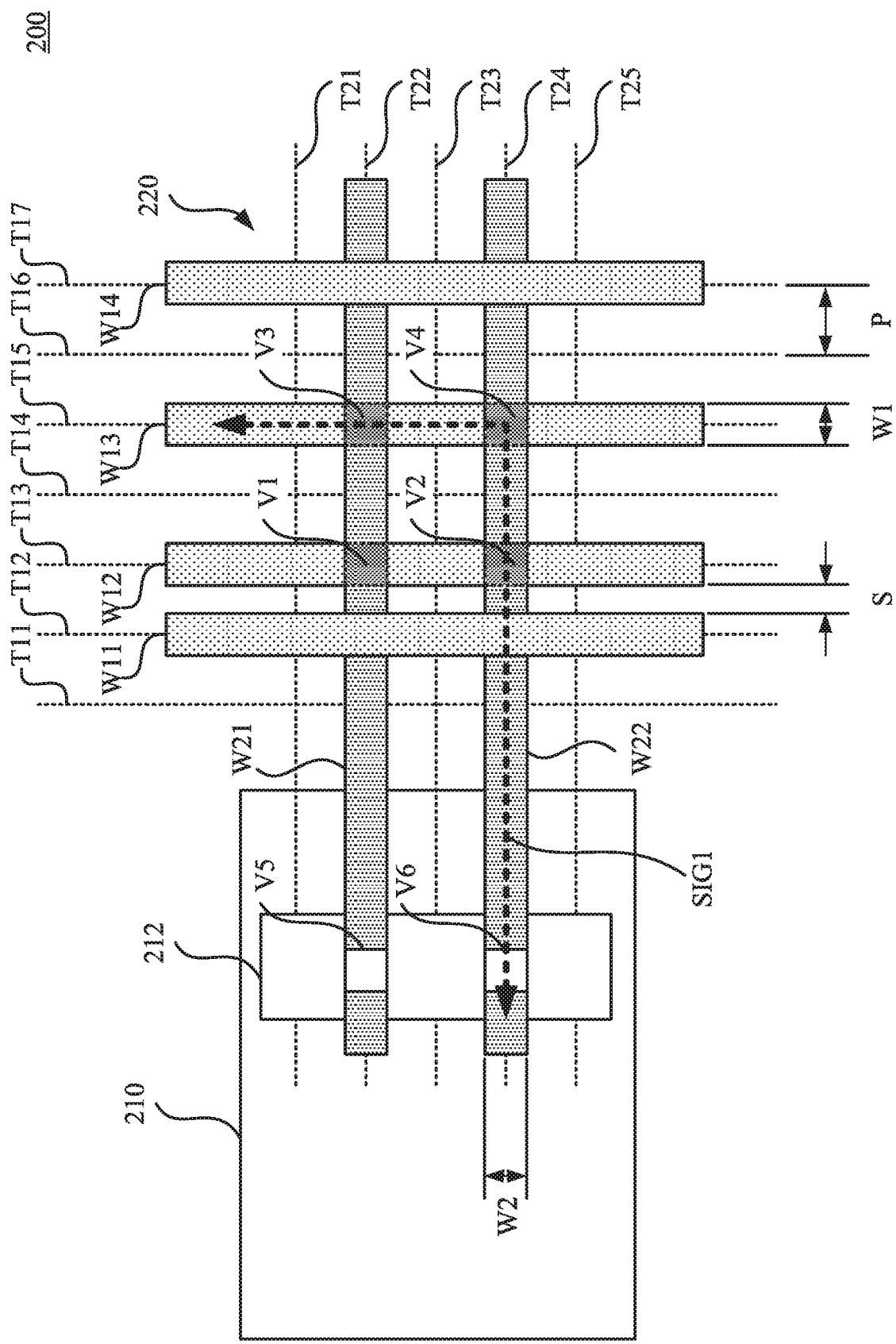
FIG. 2 is a schematic diagram of an integrated circuit in accordance with various embodiments of the present disclosure.

FIG. 2 is a schematic diagram of an integrated circuit 200 in accordance with various embodiments of the present disclosure. In some embodiments, the processor 110 is configured to perform operations of wire routing in the integrated circuit 200 according to a circuit file and at least one design rule, which are, for example, inputted from the I/O interfaces 130. As illustratively shown in FIG. 2, a routing grid 220 having routing tracks T11-T17 and T21-T25 is provided. The routing tracks T11-T17 are oriented parallel to one another, and are oriented (or extend) in a first direction, which is, for example, a vertical direction of the integrated circuit 200. The routing tracks T21-T25 are oriented in parallel with each other, and are oriented (or extend) in a second direction perpendicular to the first direction. For example, the second direction is a horizontal direction of the integrated circuit 200. In some embodiments, the routing tracks T11-T17 and the routing tracks T21-T25 are distributed in different layers of the integrated circuit 200. The routing tracks T11-T17 are arranged in a first layer of the integrated circuit 200, and the routing tracks T21-T25 are arranged in a second layer of the integrated circuit 200. Each routing track T11-T17 and T21-T25 represents a potential routing path, which is potentially being assigned a conductive segment for transmitting signals, in the integrated circuit 200. In some embodiment, a predetermined distance is present in any two adjacent routing tracks T11-T17. For example, the routing track T16 is spaced a center-to-center pitch P from adjacent routing track T17. With the arrangement of the center-to-center pitch P, a sufficient space is provided to place a feature, including, for example, a wire, and any required spacing next to the feature.

As illustratively shown in FIG. 2, the integrated circuit 200 includes a cell 210, conductive segments W11, W12, W13, W14, W21 and W22. The conductive segments W11-W22 are route to couple circuit elements (not shown) with each other or with at least one signal source (not shown), according to the default routing rule set and the circuit file. Effectively, the connections in the integrated circuit 200 are formed.

Furthermore, as illustratively shown in FIG. 2, a minimum spacing S is a distance between adjacent routed conductive segments. For example, the distance between adjacent routed conductive segments W11 and W12. The minimum spacing S is a parameter of a particular process technology node. A predetermined width W1 is the wire width of the conductive segments W11-W14 in the integrated circuit 200. A predetermined width W2 is the wire width of the conductive segments W21-W22 in the integrated circuit 200. In some embodiments, the line widths W1 and W2 are the same predetermined value. In some other embodiments, the line widths W1 and W2 are different predetermined values. Alternatively stated, in some embodiments, the center-to-center pitch P is defined to be the sum of the minimum spacing S between features and the wire width W1 and W2.

In some embodiments, a default routing rule set is applied to specify the constraints on the layout of the integrated circuit 200. The line width W1 and W2, the minimum spacing S and the center-to-center pitch P are configured according to the default routing rule set.

In some embodiments, the conductive segments W11-W22 of the integrated circuit 200 are routed and arranged on the routing tracks T11-T17 and T21-T25. For illustration, the conductive segment W11 is arranged on the routing tracks T12, the conductive segment W12 is arranged on the routing tracks T13, the conductive segment W13 is arranged on the routing tracks T15, and the conductive segment W14 is arranged on the routing tracks T17 in the vertical arrangement. On the other hand, the conductive segment W21 is arranged on the routing tracks T22, the conductive segment W22 is arranged on the routing tracks T24 in the horizontal arrangement.

In some embodiments, the cell 210 includes a terminal 212. The cell 210 is configured to output a signal SIG1 via the terminal 212 and the conductive segments W12-W13 and W21-W22. In some other embodiments, the terminal 212 of the cell 210 is configured to receive the signal SIG1 from other circuit elements (not shown) or a signal source (not shown) through the conductive segments W12-W13 and W21-W22. In other words, the cell 210 is able to communicate with other circuit elements via the terminal 212.

In some embodiments, the cell 210 is a clock signal distribution network or a power distribution network. In some cases, the clock signal distribution network or the power distribution network has special metric requirements which are non-existent for other parts of the integrated circuit 200.

For example, the power distribution network is configured to carry large current for driving the whole integrated circuit 200. As conductive electrons move within a thin, long power wire, they run into the metal particles resulting in a momentum transfer that gives rise to transport of the metal particles. This transport is called electromigration and results opens in the power wires. Local power networks have not been subject to electromigration concerns in the past. However, in emerging technology nodes the current has remained roughly constant while the cross sectional size of power wires has decreased, causing the current density in power wires to increase. The maximum current density requirement (Jmax) for guaranteeing minimum mean-time-to-failure (MTTF) due to electromigration in today's auto place and route digital circuits is limiting the drive current that can be drawn by devices. Furthermore, premature power wire electromigration leads to an increased voltage drop through a local power network, causing circuit timing and signal integrity problems that lead to functional hardware failure.

Similarly, the clock signal distribution network is configured to provide and distribute a clock signal to one or more sequential circuit elements in the integrated circuit 200. Thus, the clock signal distribution network need to satisfy special clock latency requirements.

In some embodiments, the metric requirements include a latency metric for the routing net. The latency metric corresponds to a clock latency of a longest latency clock path that includes the routing net. In some embodiments, the metric requirements include an electromigration metric for the routing net. The electromigration metric corresponds to an amount of electromigration that is expected to occur in the routing net. In some embodiments, the metric requirements include a crosstalk metric for the routing net. The crosstalk metric corresponds to an amount of crosstalk that the routing net receives from other routing nets.

The latency metric, the electromigration metric and the crosstalk metric mentioned above are related to the current on the routing net and the resistance of the routing net. For the cell 210 having such metric requirements, when one wire having default line width W1 and/or W2 is used to connect the terminal 212, the cell 210 would fail to meet the metric requirements. Accordingly, a layout violation is caused since the current amplitude of the signal SIG1 on the routing net is limited by the default line width W1 and W2.

The above examples of metrics are presented for illustration purposes only and not intended to limit the present disclosure. Various definitions of latency, crosstalk, and electromigration, will be apparent to a person having ordinary skill in the art, and the scopes of the embodiments described herein are intended to cover all such definitions.

In some approaches, some routing rules are defined to select an appropriate line width and wire spacing based on computation. For example, a non-default line width, which is wider than the line width W1 and W2 under the default rule, or a non-default spacing, which is wider than the spacing S under the default rule, is configured. In some other approaches, both the non-default line width and the non-default spacing are configured to be satisfied with the design rules, including, for example, the electromigration (EM) metric requirements, the clock latency metric requirements, the crosstalk metric requirements, etc. In these approaches, the aforementioned routing rules, which are used for routing cell having certain requirements, are referred to as a non-default routing rule set or a non-default rule (NDRs) set, in order to distinguish these routing rules from the default routing rule set.

In the aforementioned approaches applying the non-default routing rule set, circuit designers have to provide the non-default routing rule set, including the non-default line width and the non-default spacing, for routing a cell in a circuit. In some cases, as the semiconductor integration densities and the complexity of the design of the integrated circuit 200 are increased, the cell in the circuit has to be routed multiple times in these approaches, so that the non-default routing rule set is able to be iteratively fine-tuned. In addition, the routing applying the non-default routing rule is increasingly difficult for double or multiple patterning designs.

In semiconductor fabrication processes, the resolution of a photoresist pattern begins to blur at about 45 nanometer (nm) half pitch. To continue to use fabrication equipment purchased for larger technology nodes, double exposure methods have been developed. In the double or multiple patterning technologies, a pattern layout is separated into two or more masks, and some features of the pattern layout are assigned to one mask and some other features are assigned to another mask. As a result, the minimum line spacing S in the combined pattern is reduced while maintaining good resolution. For example, in the double patterning technology, each pattern on the layer is assigned a first or second "color." The patterns of the first color are formed by a first mask, and the patterns of the second color are formed by a second mask. The masks are then used to transfer the pattern layout to a wafer, pushing the photolithography limit. Since the coloring process for the non-default line width in the layout is an issue to be solved, to avoid coloring issues, larger spacing is used and results in the reduced routability. In other words, using a wider width and/or a wider spacing for routing nets consumes greater routing resources.

As illustratively shown in FIG. 2, in some embodiments, to be satisfied with the metric requirements of the cell 210 mentioned above, the signal SIG1 is configured to be transmitted via the conductive segments W21 and W22 in the integrated circuit 200. The conductive segment W21 and the conductive segment W22 are electrically connected to the terminal 212, in which the conductive segment W21 is arranged on the routing track T22. On the other hand, the conductive segment W22 is arranged on the routing track T24. The conductive segment W21 and the conductive segment W22 both have the predetermined wire width W2 according to the default routing rule set. With such arrangement, the signal SIG1 with larger current amplitude is able to be withstood by and transmitted through the conductive segments W21 and W22.

Compare to the approaches mentioned above, the default routing rule set is applied and the integrated circuit 200 is able to satisfy layout requirement without using non-default parameter configurations of the line width, the minimum spacing between adjacent routed conductive segments, or the center-to-center pitch between adjacent routing tracks. In addition, the coloring requirement in double or multiple patterning scenarios are satisfied since the default routing rule set is applied.

As illustratively shown in FIG. 2, in some embodiments, the signal SIG1 is further transmitted via the conductive segments W12 and W13. Similar to the conductive segments W21 and W22, W12 and W13 have the predetermined wire width W1. In some embodiments, the integrated circuit 200 further includes vias V1, V2, V3 and V4 coupling between two of the conductive segment W12, W13, W21 and W22. The conductive segments W21 and W22 are electrically coupled to the conductive segments W12 and W13 through the vias V1-V4, in order to transmit the signal SIG1 from or to the terminal 212. Since multiple default rule routes are used on multiple layers, a "grid" style route is assigned in the integrated circuit 200.

In some embodiments, at least one routing track T14 is arranged between the routing track T13 and the routing track T15, and at least one routing track T23 is arranged between the routing track T22 and the routing track T24. With such arrangement, at least one conductive segment is able to be arranged on the routing track T14 for transmitting other signals in the integrated circuit 200. Alternatively stated, in some embodiments, a distance of the adjacent two conductive segments W12 and W13 is greater than the predetermined wire width W1, and a distance of the adjacent two conductive segments W21 and W22 is greater than the predetermined wire width W2. Thus, the signal routes of the signal SIG1 are spaced out and the vias V1-V4 are able to be dropped in the routed tracks.

As illustratively shown in FIG. 1, the via V1 is disposed to couple the conductive segment W12 with the conductive segment W21. The via V2 is electrically coupled to the conductive segment W12 and the conductive segment W22. The via V3 is electrically coupled to the conductive segment W13 and the conductive segment W21. The via V4 is electrically coupled to the conductive segment W13 and the conductive segment W22. With the arrangements of the multiple vias V1-V4, the resistance of the route, which is configured to transmit the signal SIG1, is reduced. Accordingly, the integrated circuit 200 is prevented from violating the electromigration (EM) requirement or the clock latency requirement.

In some embodiments, the integrated circuit 200 further includes vias V5-V6. The via V5 is disposed to couple the conductive segment W21 with the terminal 212 of the cell 210. The via V6 is disposed to couple the conductive segment W22 with the terminal 212 of the cell 210.

In some approaches applying the non-default routing rule set, since the conductive segments having larger line width are used, the larger size vias are required to connect conductive segments in different layers. Compare to the approaches mentioned above, on the other hand, in some embodiments shown in FIG. 2, since the conductive segments W12-W13 and the conductive segments W21-W22 have the same predetermined wire width W2 according to the default routing rule set, vias V1-V4 have the same default via size. In addition, since the default routing rule set is applied in the embodiments shown in FIG. 2, the conductive segments W11-W22 are on-track and the routability of the integrated circuit 200 is ensured. For illustration, in some embodiments, the routing track T12 and T17 are potential routing paths for another net of the integrated circuit 200, and conductive segments W11 and W14 are assigned on the routing track T12 and T17 respectively.

Figure 3:
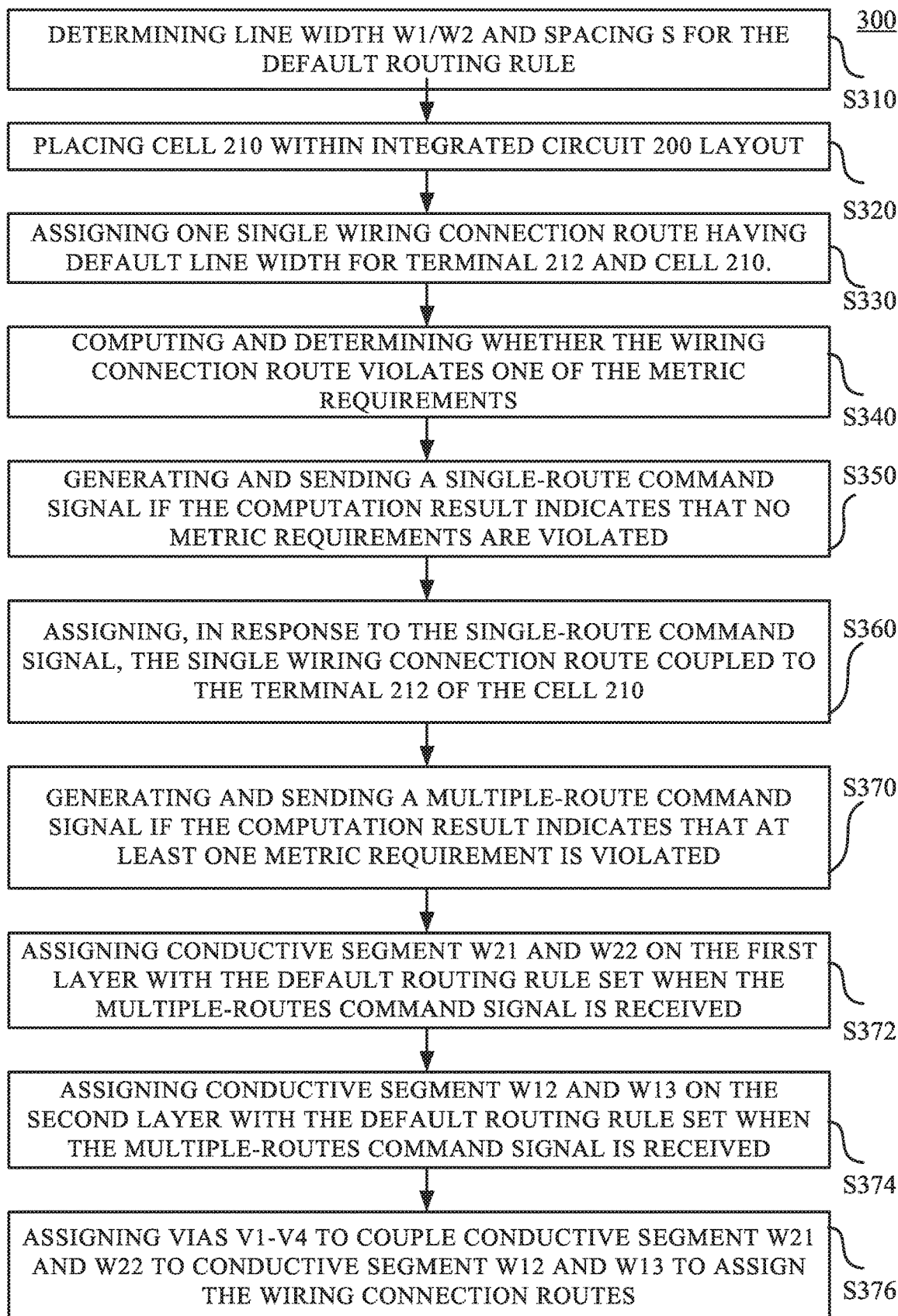
FIG. 3 is a flow chart illustrating a layout method in accordance with various embodiments of the present disclosure.

Reference is made to FIG. 3. FIG. 3 is a flow chart illustrating a layout method 300 in accordance with various embodiments of the present disclosure. The layout process of the integrated circuit 200 in FIG. 2 is also described below by the layout method 300 in FIG. 3. For better understanding of the present disclosure, the layout method 300 is discussed in relation to the integrated circuit 200 shown in FIG. 2, but is not limited thereto. In some embodiments, the integrated circuit 200 is described through various circuit simulation tools carried in the design system 100 in FIG. 1. In some embodiments, a predetermined description including layout constraints for the integrated circuit 200 is determined through various circuit simulation tools and/or electronic design automation (EDA) tools carried in the design system 100 in FIG. 1.

As illustratively shown in FIG. 3, the layout method 300 includes operations S310, S320, S330, S340, S350, S360, S370, S372, S374, and S376. First, in operation S310, the wire widths W1 and W2 and the spacing width S for the default routing rule are determined by the electronic design automation tool. In some embodiments, the wire widths W1 and W2 and the spacing width S are determined base on constraints in the design rule for integrated circuit 200 and the process technology node.

Next, in operation S320, the electronic design automation tool places the cell 210 within the integrated circuit 200 layout. In some embodiments, the cell 210 are placed using a router of the electronic design automation tool that selects a corresponding cell from a standard cell library. In some embodiments, the standard cell library is configured to store layout patterns or predetermined descriptions of standard cells. Each standard cell is configured to provide for a logical functionality. For example, in some embodiments, the standard cells include including a NAND gate, a NOR gate, a latch, inverter, etc. In some embodiments, the cell 210 is placed abutting to one another by the router.

Next, in operation S330, the electronic design automation tool assigns one single wiring connection route having default line width W1 or W2 for the terminal 212 and the cell 210.

Next, in operation S340, the electronic design automation tool computes and determines whether the wiring connection route violates one of the metric requirements when the single wiring connection route having default line width W1 and W2 is used for the terminal 212 and the cell 210. Alternatively stated, the electronic design automation tool, operated by the processor 110, determines whether a routing rule violation is present in the signal SIG1.

For example, the signal SIG1 is determined to be a clock signal, and is determined to be not satisfied with the clock latency requirement. For example, the current of the signal SIG1 is higher than a predetermined current limitation corresponding to the predetermined wire width W1 and W2 defined in the default rule. Alternatively, in other examples, the signal SIG1 is determined to be not satisfied with one of the latency, crosstalk, and electromigration requirement. When at least one of the above conditions is present in the signal SIG1, the corresponding computation result is determined to indicate that at least one metric requirement is violated.

Next, in operation S350, if the computation result indicates that no metric requirements are violated, a single-route command signal is generated and sent to the router of the electronic design automation tool.

Next, in operation S360, in response to the single-route command signal, the router of the electronic design automation tool assigns a single wiring connection route coupled to the terminal 112 of the cell 210 according to the default routing rule set. Alternatively stated, when the condition mentioned above is not present in the signal SIG1, the electronic design automation tool, operated by the processor 110, assigns a single route to the terminal 112 of the cell 210, to transmit the signal SIG1 to or output the signal SIG1 from the terminal 112 of the cell 210.

On the other hand, in operation S370, if the computation result indicates that at least one metric requirement is violated, a multiple-route command signal is generated and sent to the router of the electronic design automation tool. In some embodiments, the electronic design automation tool further computes an appropriate number of the wiring connection routes required to avoid violating the metric requirements. In some embodiments, the electronic design automation tool is configured to generate the single-route command signal or the multiple-route command signal according to the user configuration.

In operations S372-S376, in response to the multiple-route command signal, the router of the electronic design automation tool assigns the routing conductive segments according to the default routing rule set. Alternatively stated, when the condition mentioned above is present in the signal SIG1, the electronic design automation tool, operated by the processor 110, assigns multiple conductive segments to the terminal 112 of the cell 210, to transmit the signal SIG1 to the terminal 112 of the cell 210. In some embodiments, the single route and each of the conductive segments are configured to have the same wire width W1 and W2.

First, in operation S372, when the electronic design automation tool receives the multiple-routes command signal, the electronic design automation tool assigns the conductive segment W21 and the conductive segment W22 on the first layer with the default routing rule set. In some embodiments, at least one routing track T23 in the first layer is arranged between the conductive segment W21, which is arranged on the routing track T22, and the conductive segment W22, which is arranged on the routing track T24. Alternatively stated, a distance of the adjacent two conductive segments W21 and W22 is greater than the wire width W2.

Next, in operation S374, when the electronic design automation tool receives the multiple-routes command signal, the electronic design automation tool further assigns the conductive segment W12 and the conductive segment W13 on the second layer with the default routing rule set. In some embodiments, at least one routing track T14 in the second layer is arranged between the conductive segment W12, which is arranged on the routing track T13, and the conductive segment W13, which is arranged on the routing track T15. Alternatively stated, a distance of the adjacent two conductive segments W12 and W13 is greater than the wire width W1.

In some embodiments, in operation S376, the electronic design automation tool assigns vias V1-V4 to couple the conductive segment W21 and the conductive segment W22 to the conductive segment W12 and the conductive segment W13, to assign the at least two wiring connection routes according to the default routing rule set. For illustration, the via V1 is assigned to be disposed at the node, located at the intersection of the routing track T13 and T22, to couple the conductive segment W12 with the conductive segment W21. The via V2 is assigned to be disposed at the node, located at the intersection of the routing track T13 and T24, to couple the conductive segment W12 with the conductive segment W22. The via V3 is assigned to be disposed at the node, located at the intersection of the routing track T15 and T22, to couple the conductive segment W13 with the conductive segment W21. The via V4 is assigned to be disposed at the node, located at the intersection of the routing track T15 and T24, to couple the conductive segment W13 with the conductive segment W22.

In operations S372-S376, when the electronic design automation tool receives the multiple-routes command signal, the electronic design automation tool assigns at least two wiring connection routes coupled to the terminal 112 of the cell 210. In some embodiments, the electronic design automation tool assigns three or more wiring connection routes coupled to the terminal 112, in which the numbers of the wiring connection routes is determined according to the corresponding multiple-routes command signal.

The wiring connection routes coupled to the terminal 112 during operation S372-S376 are routed according to the default routing rule determined by the electronic design automation tool. Alternatively stated, the wiring connection routes are on-track with the predetermined line width W1 and W2 and minimum spacing S.

The layout method 300 results in a compact routing area by avoiding non-default routing rules which increase the line width, spacing between adjacent routed conductive segments, the center-to-center pitch between adjacent routing tracks, and the die area.

While the methods provided herein are illustrated and described above as a series of acts or events, it will be appreciated that the illustrated ordering of such acts or events are not to be interpreted in a limiting sense. The operations are not necessarily performed in the order described. For example, some acts occur in different orders and/or concurrently with other acts or events apart from those illustrated and/or described herein. In addition, not all illustrated acts may be required to implement one or more aspects or embodiments of the description herein. Further, in some embodiments, one or more of the acts depicted herein is carried out in one or more separate acts and/or phases. Alternatively stated, the order of the operations disclosed in the present disclosure are able to be changed, or the operations are able to be executed simultaneously or partially simultaneously as appropriate, in accordance with the spirit and scope of various embodiments of the present disclosure.

As described above, in the embodiments disclosed in the present disclosure, the non-default wiring connection route is replaced by multiple default wiring connection routes. Multiple vias are configured to couple the routed conductive segments arranged in different layers, which lower the resistance of the routing net and enhance the timing performance and the electromigration tolerance ability. The layout method is applied in various layout technologies including, for example, technology nodes using the double or multiple patterning technologies, as discussed in the aforementioned embodiments.

In some embodiments, a system is disclosed that includes at least one Input/Output (I/O) interface and a processor. The processor is coupled to the at least one I/O interface. The processor is configured to perform, according to a file or a rule inputted from the at least one I/O interface, operations below. When at least one condition is present in a signal to be received or transmitted by a terminal of a cell, a plurality of conductive segments is assigned to the terminal of the cell, to transmit the signal to the terminal of the cell. When the at least one condition one is not present in the signal, a single route is assigned to the terminal of the cell, to transmit the signal to the terminal of the cell. The single route and each of the conductive segments are configured to have the same width.

Also disclosed is a method that includes operations below and at least one of the operations is performed by a processor. Whether at least one condition is present in a signal to be received or transmitted by a terminal of a cell is determined. When the at least one condition is present in the signal, a plurality of conductive segments is assigned on a plurality of layers and coupled to the terminal of the cell, to transmit the signal to the terminal of the cell.

Also disclosed is a method that includes an operation below and the operation is performed by a processor. When at least one condition is present in a signal to be received or transmitted by a terminal of a cell, at least two routes are assigned to the terminal of the cell, to transmit the signal to the terminal of the cell. The at least two routes includes a first conductive segment, a second conductive segment, a third conductive segment, and a fourth conductive segment The first conductive segment and the second conductive segment are interleaved with the third conductive segment and the fourth conductive segment.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising operations, wherein at least one of the operations is performed by a processor and the operations comprise:
   determining whether at least one condition is present in a signal to be received or transmitted by a terminal of a cell of an integrated circuit; and
   when the at least one condition is present in the signal, assigning a plurality of conductive segments of the integrated circuit, that are disposed on a plurality of layers of the integrated circuit and are coupled to the terminal of the cell, to transmit the signal to the terminal of the cell.

2. The method of claim 1, wherein assigning the plurality of conductive segments on the plurality of layers and coupled to the terminal of the cell comprises:
   assigning a first set of conductive segments; and
   assigning a second set of conductive segments interleaved with the first set of conductive segments at a plurality of nodes, and coupled to the terminal of the cell.

3. The method of claim 2, wherein each conductive segment of the first set of conductive segments has a first predetermined width, and a distance of adjacent two conductive segments of the first set of conductive segments is greater than the first predetermined width.

4. The method of claim 2, wherein each conductive segment of the second set of conductive segments has a second predetermined width, and a distance of adjacent two conductive segments of the second set of conductive segments is greater than the second predetermined width.

5. The method of claim 2, wherein the operations further comprise:
assigning a plurality of vias to be disposed at the nodes, to couple the first set of conductive segments and the second set of conductive segments with the terminal of the cell.

6. The method of claim 1, wherein assigning the plurality of conductive segments on the plurality of layers and coupled to the terminal of the cell comprises:
assigning a first conductive segment to be coupled to a first node and a second node of a plurality of nodes;
assigning a second conductive segment to be coupled to a third node and a fourth node of the plurality of nodes;
assigning a third conductive segment to be coupled to the first conductive segment at the first node, and coupled to the second conductive segment at the third node; and
assigning a fourth conductive segment to be coupled to the first conductive segment at the second node, and coupled to the second conductive segment at the fourth node.

7. The method of claim 6, wherein each of the first conductive segment and the second conductive segment has a first predetermined width, and a distance between the first conductive segment and the second conductive segment is greater than the first predetermined width,
wherein each of the third conductive segment and the fourth conductive segment has a second predetermined width, and a distance between the third conductive segment and the fourth conductive segment is greater than the second predetermined width, and both of the third conductive segment and the fourth conductive segment are coupled to the terminal of the cell.

8. The method of claim 6, wherein assigning the plurality of conductive segments to the terminal of the cell further comprises:
assigning a first via to be disposed at the first node to couple the first conductive segment with the third conductive segment;
assigning a second via to be disposed at the second node to couple the first conductive segment with the fourth conductive segment;
assigning a third via to be disposed at the third node to couple the second conductive segment with the third conductive segment; and
assigning a fourth via to be disposed at the fourth node to couple the second conductive segment with the fourth conductive segment.

9. A method comprising an operation, wherein the operation is performed by a processor and the operation comprises:
when at least one condition is present in a signal to be received or transmitted by a terminal of a cell of an integrated circuit, assigning at least two routes of the integrated circuit to the terminal of the cell, to transmit the signal to the terminal of the cell,
wherein the at least two routes comprises a first conductive segment, a second conductive segment, a third conductive segment, and a fourth conductive segment of the integrated circuit,
wherein the first conductive segment and the second conductive segment are interleaved with the third conductive segment and the fourth conductive segment.

10. The method of claim 9, wherein the at least one condition comprises that a current of the signal is higher than a predetermined current limitation corresponding to a width of the first conductive segment.

11. The method of claim 10, wherein the at least one condition comprises that the current of the signal is higher than a predetermined current limitation corresponding to a width of the second conductive segment.

12. The method of claim 9, wherein the first conductive segment, the second conductive segment, the third conductive segment, and the fourth conductive segment are configured to have the same width.

13. A method comprising operations, wherein at least one of the operations is performed by a processor and the operations comprise:
when at least one condition is present in a signal to be received or transmitted by a terminal of a cell, assigning a plurality of conductive segments to the terminal of the cell, to transmit the signal to the terminal of the cell; and
when the at least one condition is not present in the signal, assigning a single route to the terminal of the cell, to transmit the signal to the terminal of the cell, wherein the single route and each of the conductive segments have the same width.

14. The method of claim 13, wherein the operations further comprise:
assigning a first set of conductive segments and a second set of conductive segments interleaved with the first set of conductive segments at a plurality of nodes and coupled to the terminal of the cell, in order to form the plurality of conductive segments.

15. The method of claim 14, wherein each conductive segment of the first set of conductive segments has a first predetermined width, and a distance of adjacent two conductive segments of the first set of conductive segments is greater than the first predetermined width.

16. The method of claim 14, wherein each conductive segment of the second set of conductive segments has a second predetermined width, and a distance of adjacent two conductive segments of the second set of conductive segments is greater than the second predetermined width.

17. The method of claim 14, wherein the operations further comprise:
assigning a plurality of vias to be disposed at the nodes, to couple the first set of conductive segments and the second set of conductive segments with the terminal of the cell.

18. The method of claim 14, wherein the operations further comprise:
assigning a first conductive segment to be coupled to a first node and a second node of the nodes;
assigning a second conductive segment to be coupled to a third node and a fourth node of the nodes;
assigning a third conductive segment to be coupled to the first conductive segment at the first node and coupled to the second conductive segment at the third node; and assigning a fourth conductive segment to be coupled to the first conductive segment at the second node and coupled to the second conductive segment at the fourth node.

19. The method of claim 18, wherein each of the first conductive segment and the second conductive segment has a first predetermined width, and a distance between the first conductive segment and the second conductive segment is greater than the first predetermined width, wherein each of the third conductive segment and the fourth conductive segment has a second predetermined width, and a distance between the third conductive segment and the fourth conductive segment is greater than the second predetermined width, and both of the third conductive segment and the fourth conductive segment are coupled to the terminal of the cell.

20. The method of claim 18, wherein the operations further comprise:

assigning a first via to be disposed at the first node to couple the first conductive segment with the third conductive segment;

assigning a second via to be disposed at the second node to couple the first conductive segment with the fourth conductive segment;

assigning a third via to be disposed at the third node to couple the second conductive segment with the third conductive segment; and assigning a fourth via to be disposed at the fourth node to couple the second conductive segment with the fourth conductive segment.

* * * * *